(12) United States Patent
Heger

(10) Patent No.: US 7,714,567 B2
(45) Date of Patent: May 11, 2010

(54) POWER CABLE MAGNETIC FIELD SENSOR

(75) Inventor: Charles E. Heger, Saratoga, CA (US)

(73) Assignee: Heger Research LLC, Saratoga, CA (US)

( * ) Notice: Subject to any disclaimer, the term of this patent is extended or adjusted under 35 U.S.C. 154(b) by 214 days.

(21) Appl. No.: 12/143,804

(22) Filed: Jun. 22, 2008

(65) Prior Publication Data

US 2009/0315555 A1    Dec. 24, 2009

(51) Int. Cl.
*G01R 1/20*    (2006.01)

(52) U.S. Cl. .................................. 324/126; 324/117 R

(58) Field of Classification Search .................. None
See application file for complete search history.

(56) References Cited

U.S. PATENT DOCUMENTS 5,091,697 A  *  2/1992  Roth et al. .................. 324/253

* cited by examiner

*Primary Examiner*—Minh N Tang
(74) *Attorney, Agent, or Firm*—Silicon Valley Patent Group LLP

(57) ABSTRACT

A method and apparatus to detect non-cancelled magnetic field produced when current flows through an electric conductor are provided. The sensor includes multiple coils, which allow the sensor to be arbitrarily oriented and attach to the outside of an electrical power cable. Arbitrary orientation provides for easy of field installation.

21 Claims, 11 Drawing Sheets

POWER CABLE MAGNETIC FIELD SENSOR

CROSS-REFERENCE TO RELATED APPLICATIONS

Not applicable.

BACKGROUND OF THE INVENTION

1. Field of the Invention

The invention relates generally to magnetic field sensors and more specifically the detection of whether a non-shielded multi-conductor power cable is energized.

2. Background of the Invention

A sensor may be used to monitor a power cable to detect whether current is flowing in the cable. The sensor may be connected to an alarm which becomes active when either current flows or alternatively when current ceases to flow. For example, a sensor may be used to activate an LED when current is running through the power cable. Alternatively, a sensor may be used to activate an alarm if current is cut from the power cable.

To monitor current flow through the power cable, power first must be disconnected. With power disconnected, a resistive device may be placed in line with or a toroid placed around an electrical conductor in the cable to sense a current flow or a magnetic field. These monitors must break and/or isolate a single conductor from the power cable in order to monitor current through the power cable.

Therefore, a need exists to monitor a power cable without interrupting electrical flow and without breaking the electrical connection.

SUMMARY

Embodiments of the present invention provide a sensor and method to detect non-cancelled magnetic field produced when current flows through an electric conductor. The sensor includes multiple coils, which allows the sensor to be arbitrarily oriented and attach to the outside of an electrical power cable. Arbitrary orientation provides for easy field installation.

Some embodiments of the present invention provide for a sensor to detect an electrical current in plurality of electrical wires, the sensor comprising: a first magnetic field sensing coil providing a first sensed signal and having a first port and a center axis; a first amplifier having an input port coupled to the first port of the first magnetic field sensing coil and an output port; a second magnetic field sensing coil providing a second sensed signal and having a first port and defining a center axis; a second amplifier having an input port coupled to the first port of the second magnetic field sensing coil and an output port; an amplitude detector having a first input port coupled to the output port of the first amplifier, a second input port coupled to the output port of the second amplifier, and an output port; and a comparator having a first input port coupled to the output port of the amplitude detector, a second input port couple to a source of a reference value, and an output port to provide an indication of a presence of the electrical current; wherein the center axis of the first coil and the center axis of the second coil form a positive angle.

Some embodiments of the present invention provide for a method of detecting an electrical current in a plurality of electrical wires using a sensor, the method comprising: sensing a first sensed signal with a first magnetic field sensing coil, wherein the first magnetic field sensing coil defines a center axis; amplifying the first sensed signal; sensing a second sensed signal with a second magnetic field sensing coil, wherein the second magnetic field sensing coil defines a center axis, and wherein the center axis of the first magnetic field sensing coil and the center axis of the second magnetic field sensing coil define a first positive angle; amplifying the second sensed signal; determining a maximum amplitude from the first sensed signal and the second sensed signal; comparing the maximum amplitude to a reference value to form a comparison result; and indicating comparison result is greater than the reference value to provide an indication of a presence of the electrical current; wherein the center axis of the first coil and the center axis of the second coil form a positive angle.

Some embodiments of the present invention provide for a sensor to detect an electrical current in plurality of electrical wires, the sensor comprising: a first means for sensing a first magnetic field to provide a first sensed signal; a first means for amplifying the first sensed signal; a second means for sensing a second sensed signal; a second means for amplifying the second sensed signal; a means for determining a maximum amplitude from the first sensed signal and the second sensed signal; a means for comparing the maximum amplitude to a reference value to form a comparison result; and a means for indicating the comparison result to provide an indication of a presence of the electrical current; wherein a center axis of the first sensing means and a center axis of the second sensing means form a positive angle.

These and other aspects, features and advantages of the invention will be apparent from reference to the embodiments described hereinafter.

BRIEF DESCRIPTION OF THE DRAWINGS

Embodiments of the invention will be described, by way of example only, with reference to the drawings.

DETAILED DESCRIPTION OF THE INVENTION

In the following description, reference is made to the accompanying drawings, which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense. Furthermore, some portions of the detailed description that follows are presented in terms of procedures, steps, logic blocks, processing, and other symbolic representations of operations on data bits that can be performed in electronic circuitry or on computer memory. A procedure, computer executed step, logic block, process, etc., are here conceived to be a self-consistent sequence of steps or instructions leading to a desired result. The steps are those utilizing physical manipulations of physical quantities. These quantities can take the form of electrical, magnetic, or radio signals capable of being stored, transferred, combined, compared, and otherwise manipulated in electronic circuitry or in a computer system. These signals may be referred to at times as bits, values, elements, symbols, characters, terms, numbers, or the like. Each step may be performed by hardware, software, firmware, or combinations thereof.

Figure 1A:
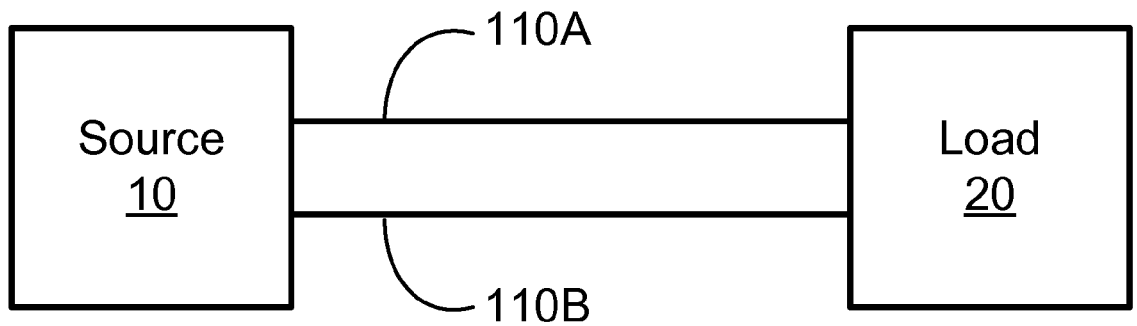
FIGS. 1A, 1B and 1C show an electrical circuit and monitoring of the electrical connection.
Figure 1B:
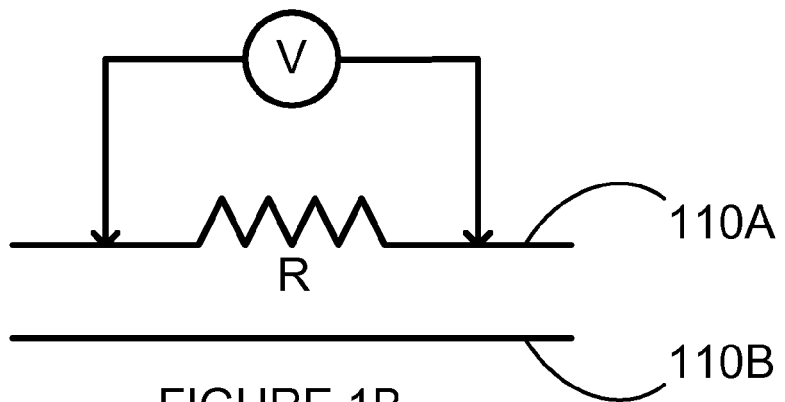
Figure 1C:
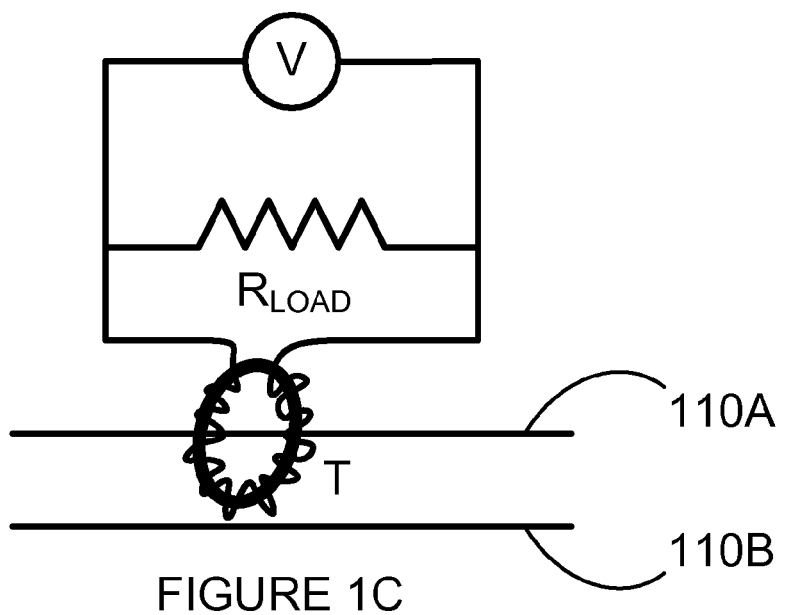

FIGS. 1A, 1B and 1C show an electrical circuit and monitoring of the electrical connection. FIG. 1 shows a source 10 of electrical power and a corresponding load 20 connected by a power cable including first electrical path using a first electrical conductor 110A and its corresponding return path using a second electrical conductor 110B. FIG. 1B shows a first example of an in-line sensor for a power cable including two conductors 110A and 110B. To install the sensor, power is first disconnected. Next, the first electrical conductor 110A is broken and a low-impedance resistor R is inserted into the electrical path. A volt meter is placed across the resistor R. Once current passes through the power cable, a voltage drop across the resister R is measured by the volt meter.

FIG. 1C shows a second example of a sensor for a power cable including two conductors 110A and 110B. To install the sensor, power is first disconnected. Next, the first electrical conductor 110A is broken and reconnected after passing through a toroid T. A resister $R_{LOAD}$ and a volt meter are connected in parallel to the toroid. Once current passes through the power cable, a magnetic field imposes a current across the resister $R_{LOAD}$ causing a voltage drop across the resister, which is measured by the volt meter.

Figure 2:
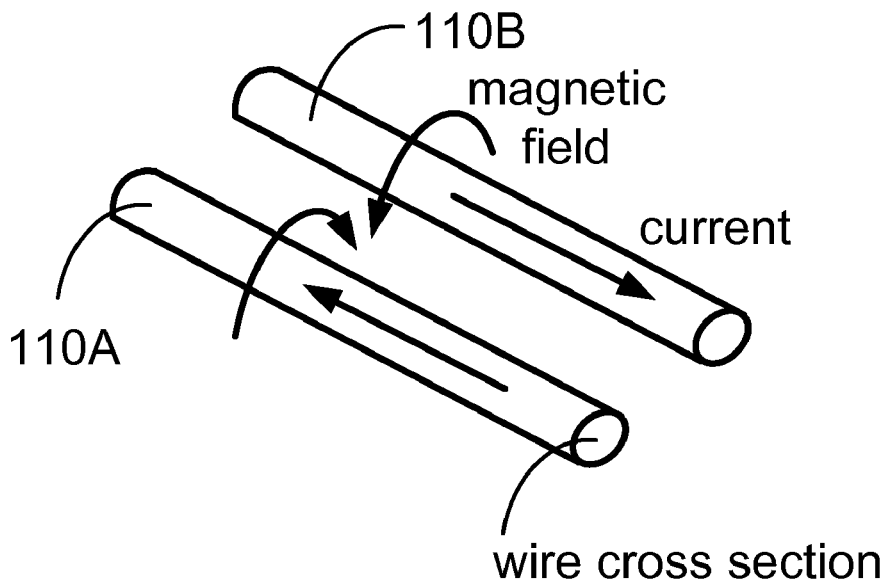
FIGS. 2, 3, 4 and 5 show electrical conductors and associated magnetic fields.
Figure 3:
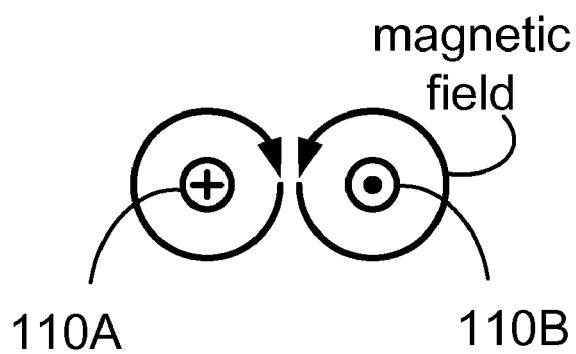

FIGS. 2, 3, 4 and 5 show electrical conductors and associated magnetic fields. In FIG. 2, two electrical conductors 110A and 110B are shown running parallel one another and carrying an alternating current. The figure illustrates a current at one moment in time during the cycle of the alternating current. The changing current generates a magnetic field as shown. In FIG. 3, a cross-section of the parallel electrical conductors of FIG. 2. In the first electrical conductor 110A a current goes into the conductor (into the paper as shown by the tail of an arrow) and the second electrical conductor 110B a current comes from the conductor (out from the paper as shown by the head of an arrow). Corresponding magnetic fields following the right-hand rule are also illustrated. The first electrical conductor 110A generates a counter-clockwise magnetic field and the second electrical conductor 110B generates a clockwise magnetic field as illustrated.

Figure 4:
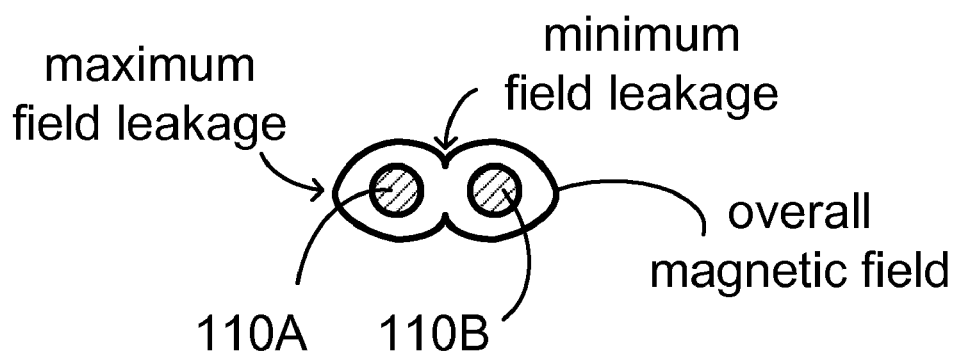
Figure 5:
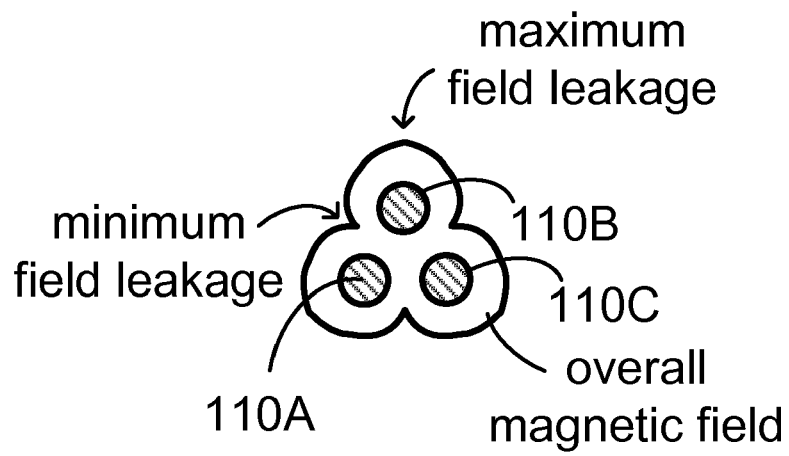

FIG. 4 shows another cross section of the first and second electrical conductor 110A and 110B. In the figure an overall magnetic field from the combined effect of both currents is illustrated. At a first region near conductor 110A and farthest away from conductor 110B, maximum field leakage occurs. A corresponding point farthest away from conductor 110A and near conductor 110B, exhibits an equivalent maximum field leakage region. At a second region around a plane separating the two conductors 110A and 110B, a minimum field leakage occurs. FIG. 5 shows a different cross-sectional view of three electrical conductors, for example from a three-phase power cable. A first electrical conductor 110A, a second electrical conductor 110B and a third electrical conductor 110 run parallel to one another. A three-phased alternating current runs in the power cable, which generates similar magnetic fields. The magnetic fields generate a combined leakage field with equivalent maximum and minimum regions. For example, in a first region away from conductors 110A and 110C and near conductor 110B, a region of maximum field leakage occurs. In a second region between conductors 110A and 110B and away from 110C, a first region of minimum field leakage occurs.

Figure 6:
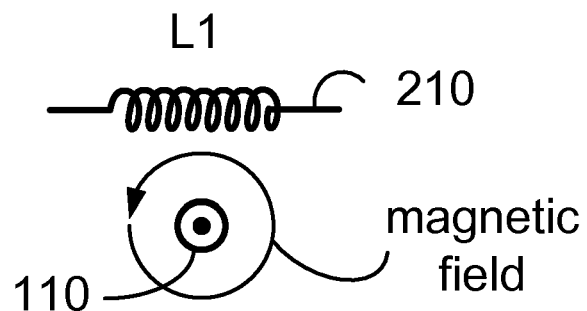
FIG. 6 illustrates an electrical conductor, its associated magnetic field and an inductor.

FIG. 6 illustrates an isolated electrical conductor 110, its associated magnetic field and an inductor L 210. The electrical conductor 110 is shown going into the paper and separate from any other electrical conductors. The inductor L 210, on the other hand, is shown away from and perpendicular to the electrical conductor 110. This relative position between an electrical conductor and an inductor provides a maximum electro-magnetic coupling between the alternating current in the electrical conductor 110 and a circuit (not shown) electrically connected to the inductor L 210.

Figure 7:
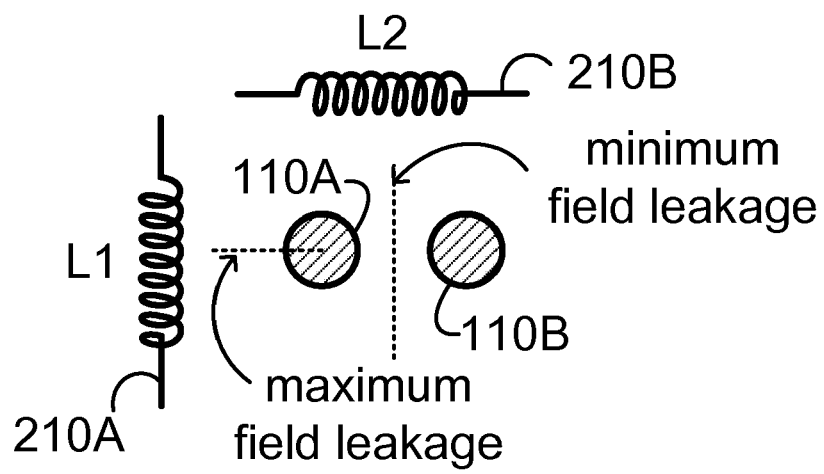
FIG. 7 illustrates a cross-section of conductors in an electrical power cable and a pair of inductors positioned relative to the conductors.

FIG. 7 illustrates a cross-section of conductors 110A and 110B from an electrical power cable and a pair of inductors 210A and 210B positioned relative to the conductors 110A and 110B and each other, in accordance with embodiments of the present invention. The electrical power cable includes a first electrical conductor 110A and a second electrical conductor 110B both going into the page. A first inductor L1 210A is positioned near and perpendicular to the first electrical conductor 110A and away from the second electrical conductor 110B. A second inductor L2 210B is also positioned perpendicular to but equally near both the conductors 110A and 110B and perpendicular to the first inductor L1 210A.

As shown in FIG. 4 and again here in FIG. 7, a first region near the first electrical conductor 110A and away from the second electrical conductor 110B provides maximum field leakage. A second region near both the first and second electrical conductors 110A and 110B provides minimum field leakage. The first inductor L1 210A is positioned in the first region of maximum field leakage and the second inductor L2 210B is positioned in the second region of minimum field leakage. When an alternating current is passing through the first and second electrical conductors 110A and 110B, the first inductor L1 210A provides maximum coupling between the first inductor L1 210A and the power cable. The second inductor L2 210B in the region of minimum field leakage has effectively no coupling between the circuits.

By positioning the first and second inductors L1 210A and L2 210B perpendicular to one another, at least one of the two will be advantageously positioned relative to the conductors in a power cable. That is, one of the inductors will be positioned close to a single electrical conductor and farther away from the remaining one or more electrical conductors. The inductor so positioned will provide non-zero coupling between the power cable and the inductor. As such, a power cable may be arbitrarily positioned relative to an assembly of two or more inductors where the inductors are positioned at positive angles relative to one another. Though the inductors L1 210A and L2 210B are shown perpendicular to one another, having them spaced a distance away from each other and at a positive angle greater than zero degrees and less than 180° (e.g., 120°, 90° (that is, perpendicular as shown), 60°, or approximately at these angles at 120°±20°, 120°±10°, 120°±5°, 90°±20°, 90°±10°, 90°±5°, 60°±20°, 60°±10°, or 60°±5°). In each case, the inductors are positioned perpendicular or approximately perpendicular relative to a power cable and may be positioned in the same plane with one another. Such positioning between the assembly of inductors and the power cable will guarantee that at least one of the inductors has non-zero coupling with a power cable.

FIGS. 8A, 8B, 8C, 9, 10 and 11 illustrate sensors 200 having a housing 201 including two or more inductors and holding an electrical power cable 100, in accordance with embodiments of the present invention.

Figure 8A:
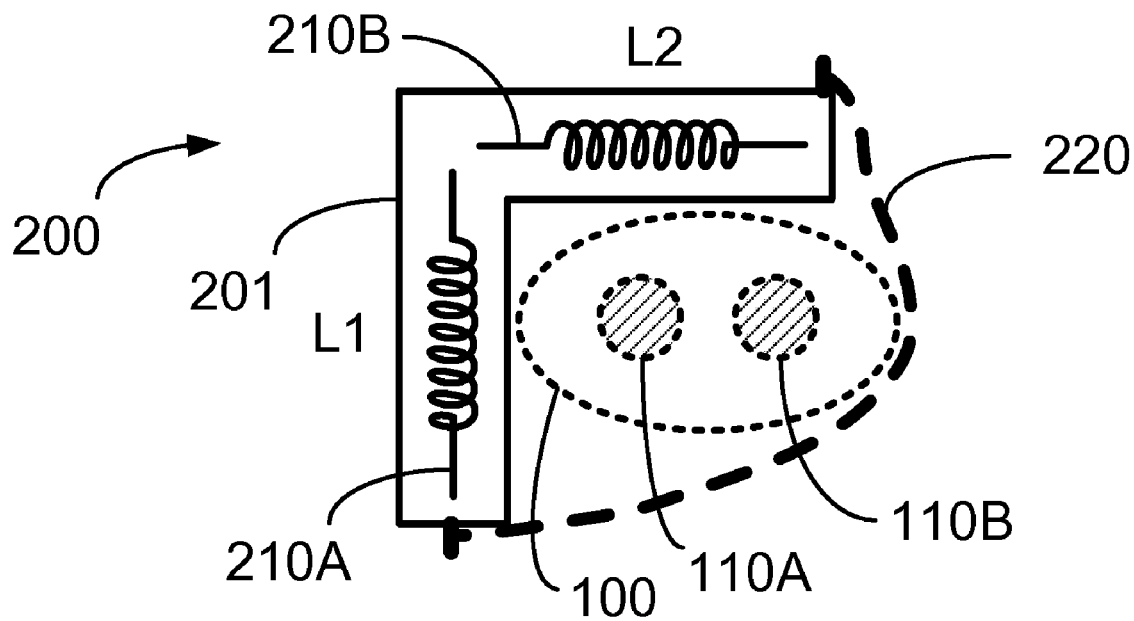
FIGS. 8A, 8B, 8C, 9, 10 and 11 illustrate sensors having a housing including two or more inductors and holding an electrical power cable, in accordance with embodiments of the present invention.

In FIG. 8A, the electrical power cable 100 includes first and second electrical conductors 110A and 110B. The housing 201 includes the first inductor L1 210A and the second inductor L2 210B positioned perpendicular to one another. The housing 201 is attached to a locking mechanism 220, such as a band, rubber band or belt. Alternatively, the housing 201 is formed to provide the functionality of the locking mechanism 220 as part of the housing 201. For example, a housing may be formed in two parts that, when assembled together, wrap around the power cable. The two parts may be fastened together with one or more screws, clips, rubber bands, pieces of Velcro® material, or the like. The example in FIG. 8A shows a rubber band attached to two ends of a one piece sensor (e.g., at two corresponding posts) thereby holding the sensor 200 against the power cable. The locking mechanism 220 restrains the power cable to a position perpendicular to the inductors in the housing 201.

Figure 8B:
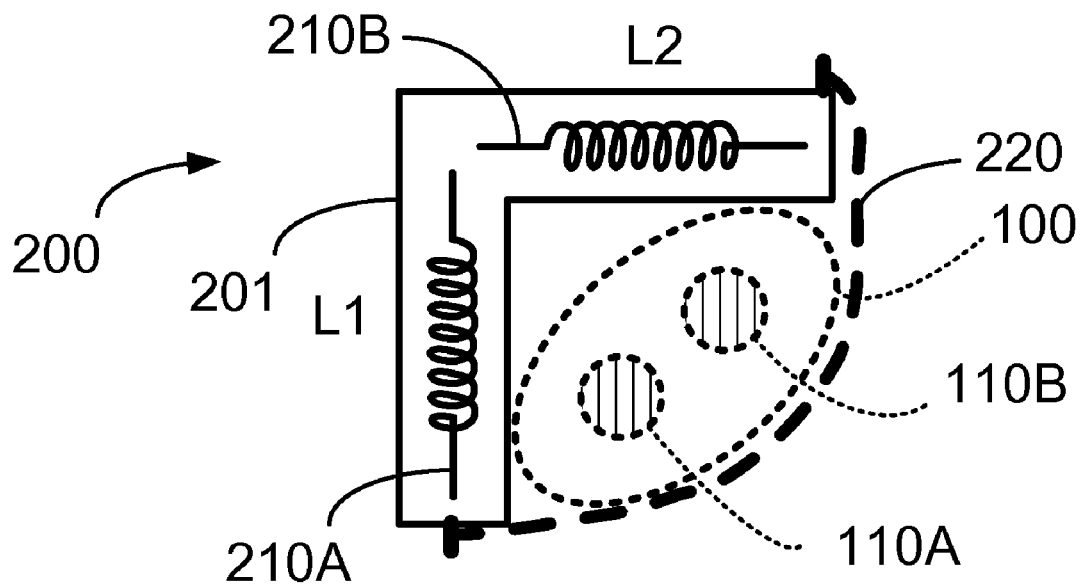

In FIG. 8A, first inductor L1 210A is shown positioned close to the first electrical conductor 110A but far away from the second electrical conductor 110B where as the second inductor L2 210B is shown positioned equally close to the first and second electrical conductors 110A and 110B. In this relative position between housing 201 and the power cable 100, the first inductor L1 210A is in a region of maximum magnetic leakage while the second inductor L2 210B is in a null or in a region of little magnetic leakage. Therefore, even though one of the inductors is in a leakage null, the other inductor is not in a leakage null. FIG. 8B shows the housing 201 and power cable 100 of FIG. 8A, however, the power cable 100 is in a rotated position (45° from FIG. 8A) relative to the housing 201. In this relative position, neither inductor is in a null region. Therefore, both inductors are positioned to sense a magnetic change in the power cable.

Figure 8C:
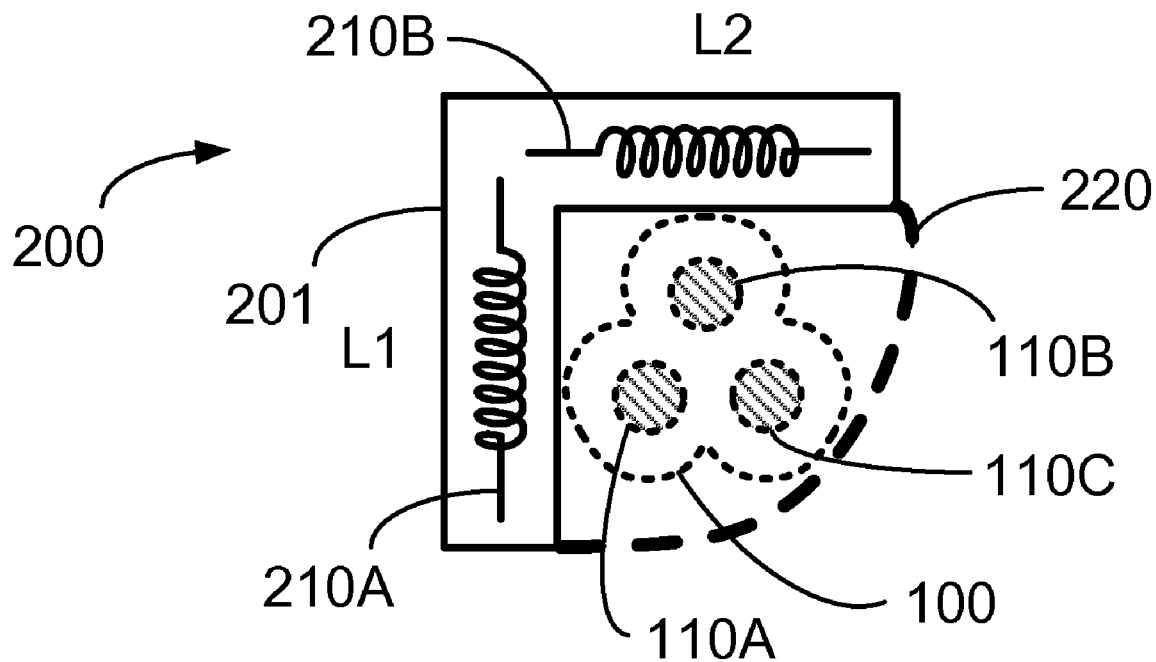

FIG. 8C shows a sensor 200 including a housing 201 having two inductors 210A and 210B at a 90° (right angle) and a locking mechanism 220, in accordance with embodiments of the present invention. The two-wire power cable from FIGS. 8A and 8B has been replaced with a three-wire power cable 100, which includes three electrical conductors 110A, 110B and 110C. Because the sensor 200 includes two inductors 210A and 210B positioned apart and at relative angle to one another, at least one of the inductors (210A or 210B) power cable is positioned to be away from a minimal region of magnetic leakage.

Figure 9:
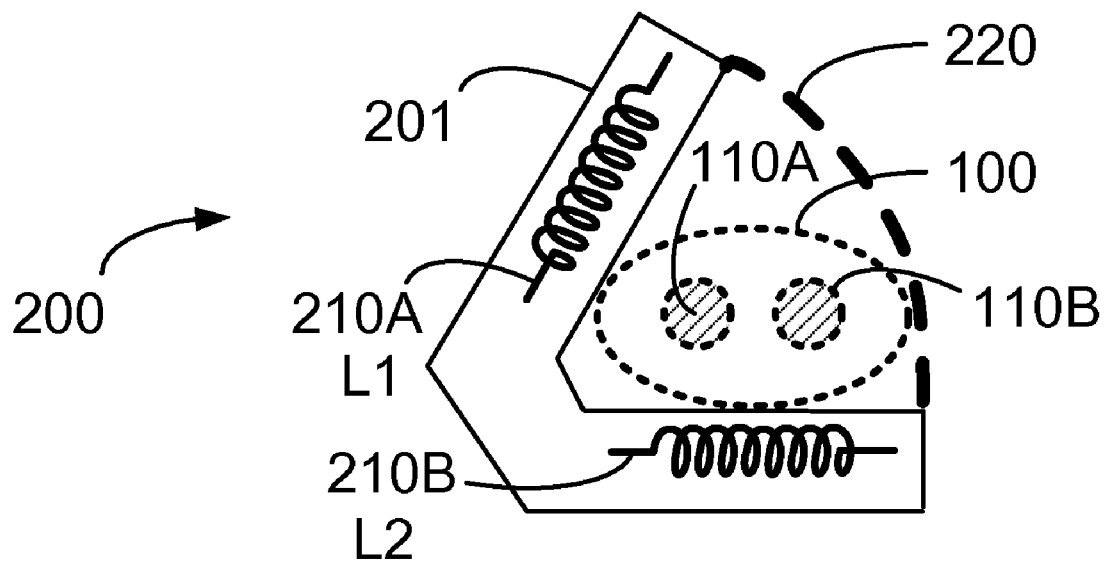

FIG. 9 shows a sensor 200 including a housing 201 including two inductors 210A and 210B at a 60-degree angle and a locking mechanism 220, in accordance with embodiments of the present invention. The housing 201 is shaped in a wedge to assist in holding the power cable 100. The locking mechanism may be provided by the housing 201 being hinged, semi-flexible or flexible. The first inductor 210A is positioned away from the region of minimum magnetic leakage, therefore provides a maximum signal. The second inductor, on the other hand, is shown positioned directly in the region of a minimum magnetic leakage, therefore provides a minimum to no signal to the sensor.

Figure 10:
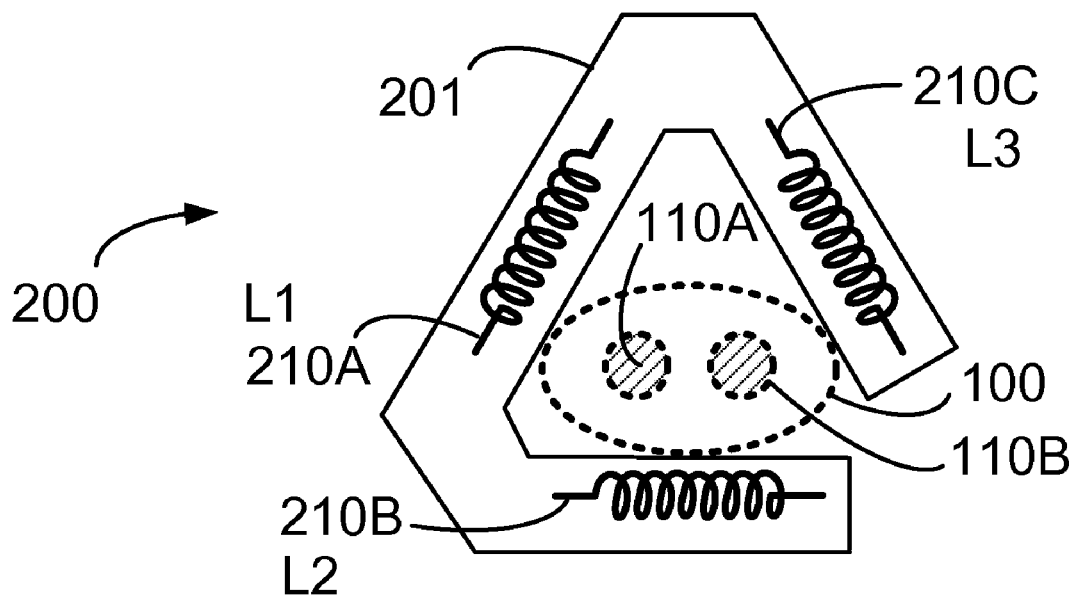

FIG. 10 shows a sensor 200 including three inductors at 60-degree angles, in accordance with embodiments of the present invention. The sensor 200 includes a housing 201 and three inductors 210A, 210B and 210C oriented to surround or encompass a cross-section of the power cable 100. Increasing the number of inductors helps to insure that one of the multiple inductors will be near a region of maximum magnetic leakage. The power cable shown creates a region of minimum magnetic leakage near the second inductor 210B but a non-minimum regions of magnetic leakage are presented to the remaining inductors 210A and 201C.

Figure 11:
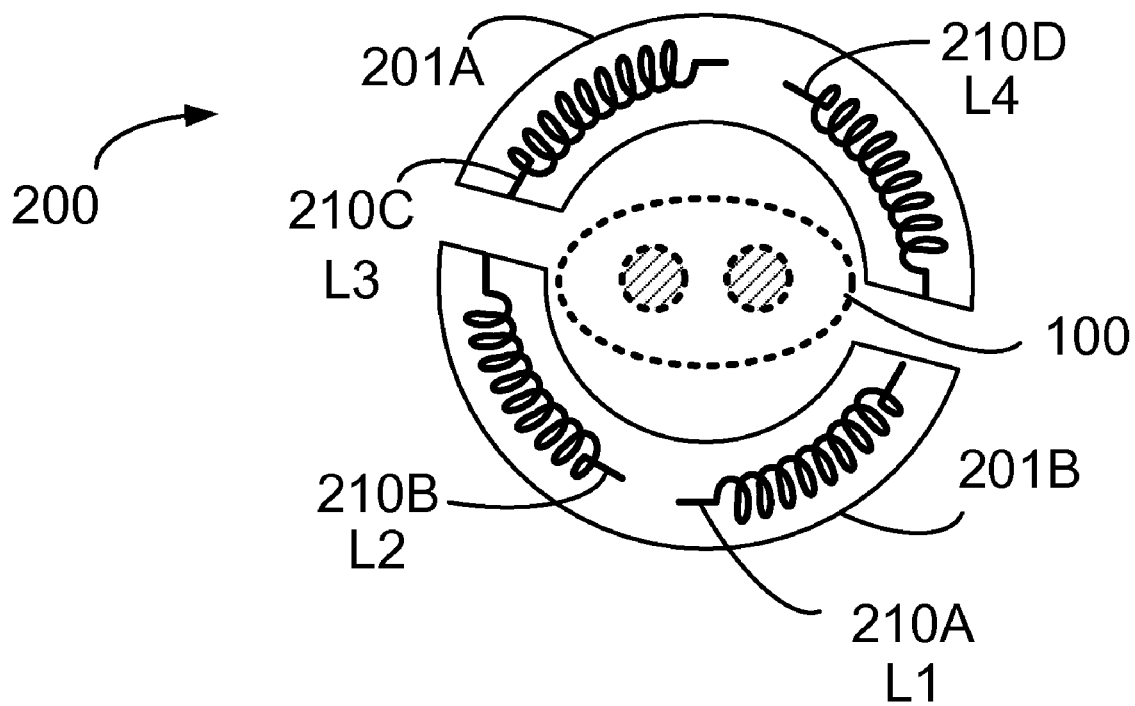

FIG. 11 shows a sensor 200 including a housing 201A and 201B and four inductors 210A, 210B, 210C and 210D, in accordance with embodiments of the present invention. The inductors described above have been presented in the form of a cylinder with or without a ferrous core. Alternatively, the inductors arched or otherwise shaped to better wrap around a power cable. The sensor 200 includes four inductors 210A, 210B, 210C and 210D and a housing including to sections 201A and 201B. A locking mechanism (not shown) may be used to secure the housing halves together, for example, by screws, snaps, bands, other fasteners, or the like.

Figure 12:
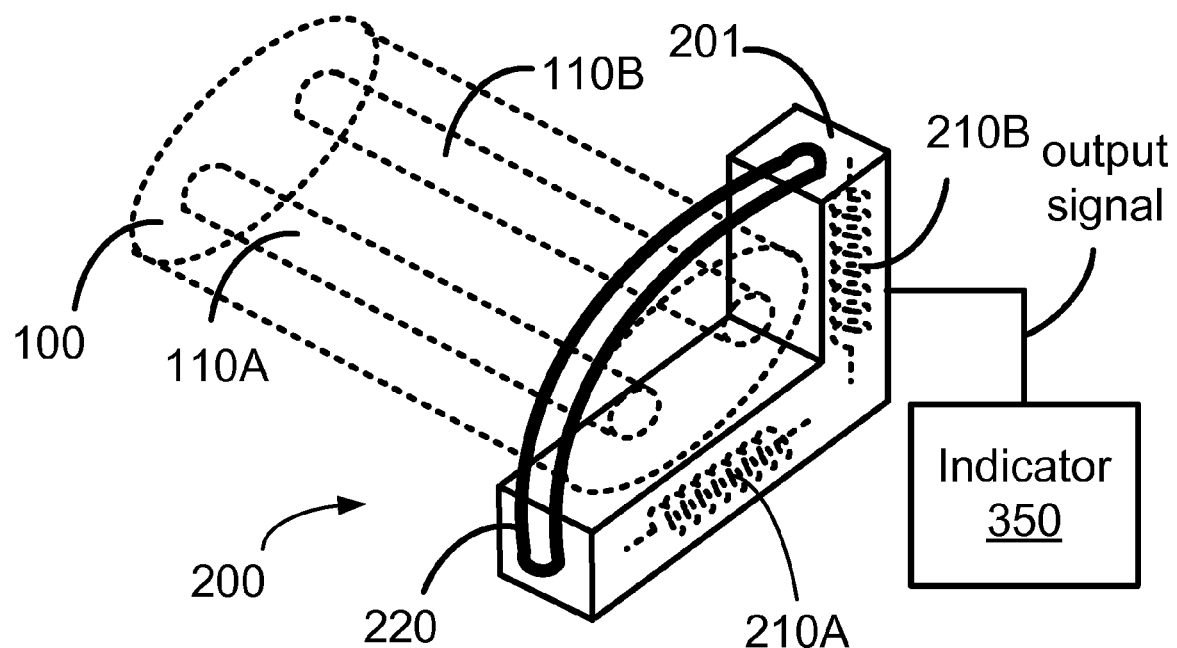
FIGS. 12 and 13 show a prospective view of sensors having a housing holding an electrical power cable, in accordance with embodiments of the present invention.
Figure 13:
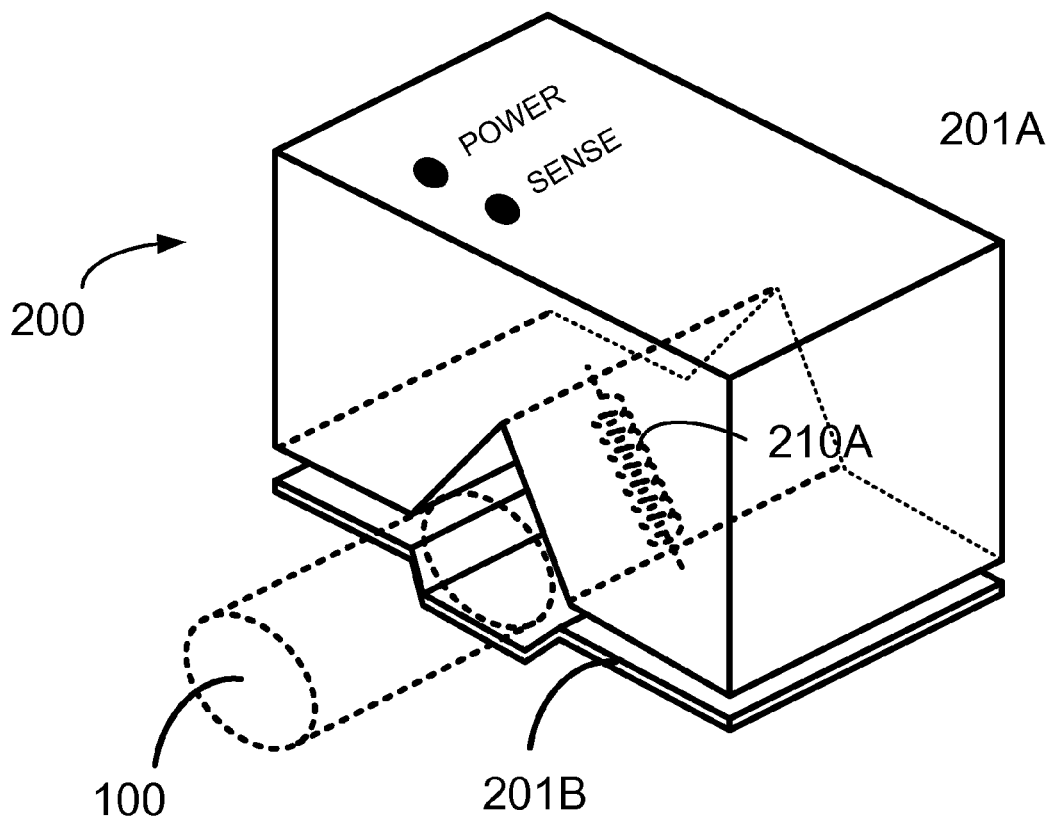

FIGS. 12 and 13 show a prospective view of sensors 200 having a housing holding an electrical power cable 100, in accordance with embodiments of the present invention. In FIG. 12, a sensor 200 includes a housing 201, a locking mechanism 220, a pair of inductors 210A and 210B hidden in the housing 201, and an indictor 350. The locking mechanism 220, which may be a rubber band or other mechanism, holds a power cable 100, including electrical conductors 110A and 110B, against the inductors 210A and 210B in the housing 201. The indicator 350 is coupled to electronic circuitry in the sensor 200 and may be used to indicate if current is detected, power is lost or power changes (between on and off or off and on). The indicator may provide an audio (e.g., a speaker) or visual (e.g., an LED) alert to an operator. Alternately, the indicator may provide a signal (such as an electrical signal) to external circuitry used for monitoring one or more power cables.

FIG. 13 shows a sensor 200 having a housing comprising a first assembly 201A and a second assembly 201B. The first assembly 201A contains the electronics, inductors and indicators. The electronics are further described below. The inductor 210A is positioned on a ramp in the first assembly 200A. The second assembly 201B is a flat plate or a formed plate used as a locking mechanism to hold a power cable 100 against the inductors in the first assembly 201A. Also shown are two indicators: a first indicators shows if the sensor 200 is receiving power; and a second indicator shows if current is flowing through a power cable.

Figure 14:
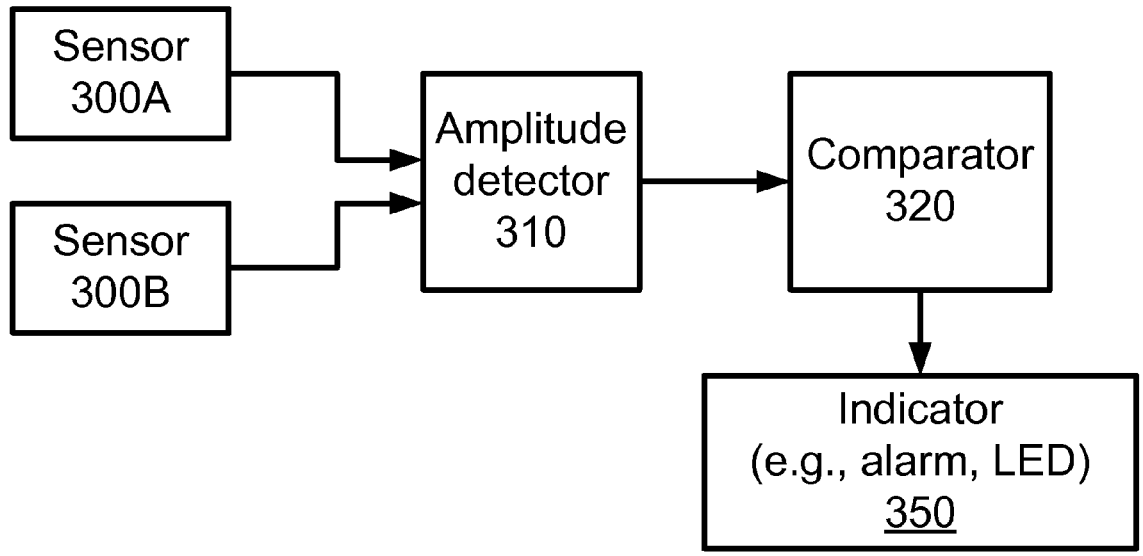
FIG. 14 is a block diagram of a sensor, in accordance with embodiments of the present invention.

FIG. 14 is a block diagram of a sensor 200, in accordance with embodiments of the present invention. The sensor 200 includes a first sensor 300A, a second sensor 300B, an amplitude detector 310, a comparator 320 and an indicator 350. The first sensor 300A includes a first magnetic field sensing coil 210A and a first amplifier (neither shown). Similarly, the second sensor 300B includes a second magnetic field sensing coil 210B and a second amplifier (neither shown). The coils may be air coils or filled coils such as by a ferrite core. The first sensor 300A and second sensor 300A sense non-minimum leakage magnetic field and each provide a sensed signal to the amplitude detector 310.

The amplitude detector 310 may simply be a maximum amplitude selector or switch that selects the maximum of the two sensed signals and provides that maximum signal to the comparator 320. Alternatively, the amplitude detector 310 or signal paths leading to the amplitude detector 310 may pre-process the two sensed signals, for example, by filtering such as by RMS averaging, low pass filtering or the like. The amplitude detector 310 does not simply add or sum the signals from the coils but instead passes the larger of the input signals as an output signal. An adder has the unwanted ability to sum two large magnitude signals of opposite sign to become a negligible or null signal, which would mask the presence of an active power cable. Alternatively, an absolute value of the input signals may be taken to remove phase information and thus insuring signals do not cancel each other.

The comparator 320 receives an output signal of the amplitude detector 310. In some embodiments, the comparator 320 also includes an input for one or more reference values. The comparator 320, based on the relative values between the maximum amplitude and the reference value, provides an indication of a presence of the electrical current. The first and second coils are positioned to form a positive angle, thereby providing at least one coil positioned to receive a signal from an arbitrarily positioned power cable.

FIGS. 15A, 15B, 16, and 17 are schematic diagrams of a sensor, in accordance with embodiments of the present invention.

Figure 15A:
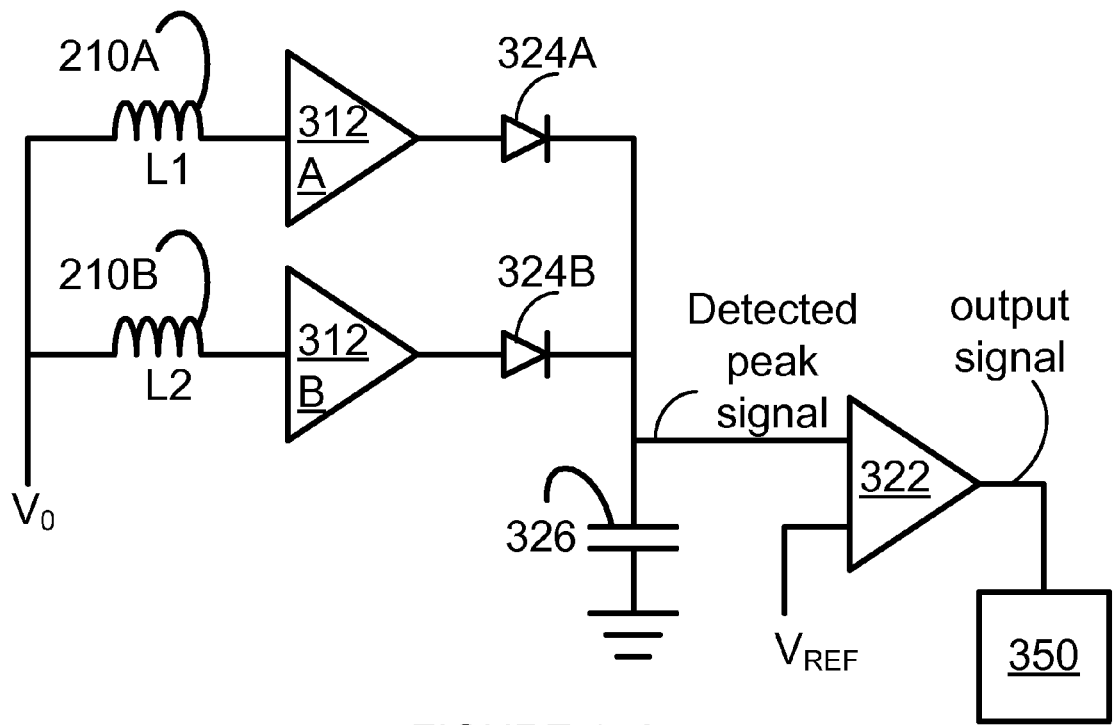
FIGS. 15A, 15B, 16 and 17 are schematic diagrams of a sensor, in accordance with embodiments of the present invention.

FIG. 15A shows a sensor 200 that includes a first input signal path, a second input signal path, a capacitor 326 and a comparator 322. In some embodiments, the sensor 200 also includes an indicator 350. The first signal input path including an inductor 210A, an amplifier 312A and a diode 324A coupled in series. The second signal input path, coupled in parallel to the first input signal path, also includes an inductor 210B, an amplifier 312B and a diode 324B coupled in series. The first and second input signal paths may be coupled to a common source signal $V_0$ (e.g., a ground, a high voltage, a low voltage or a bias voltage). An amplitude detector 310 is implemented with a pair of diodes 324A and 324B. The output signals from each path is combine by the diodes 324A and 324B connected to act as an analog-OR circuit such that the maximum of the two signals is feed to the capacitor and to an input port of the comparator 322. Thus, the two diodes 324A and 324B perform the function of the amplitude detector 310. The comparator 322 compares the maximum signal to one or more reference signals or reference values (e.g., $V_{REF}$). For example, if the maximum signal is above the reference signal, then the output signal from the comparator 322 provides direction to the indicator 350 to alarm or signal as desired.

Figure 15B:
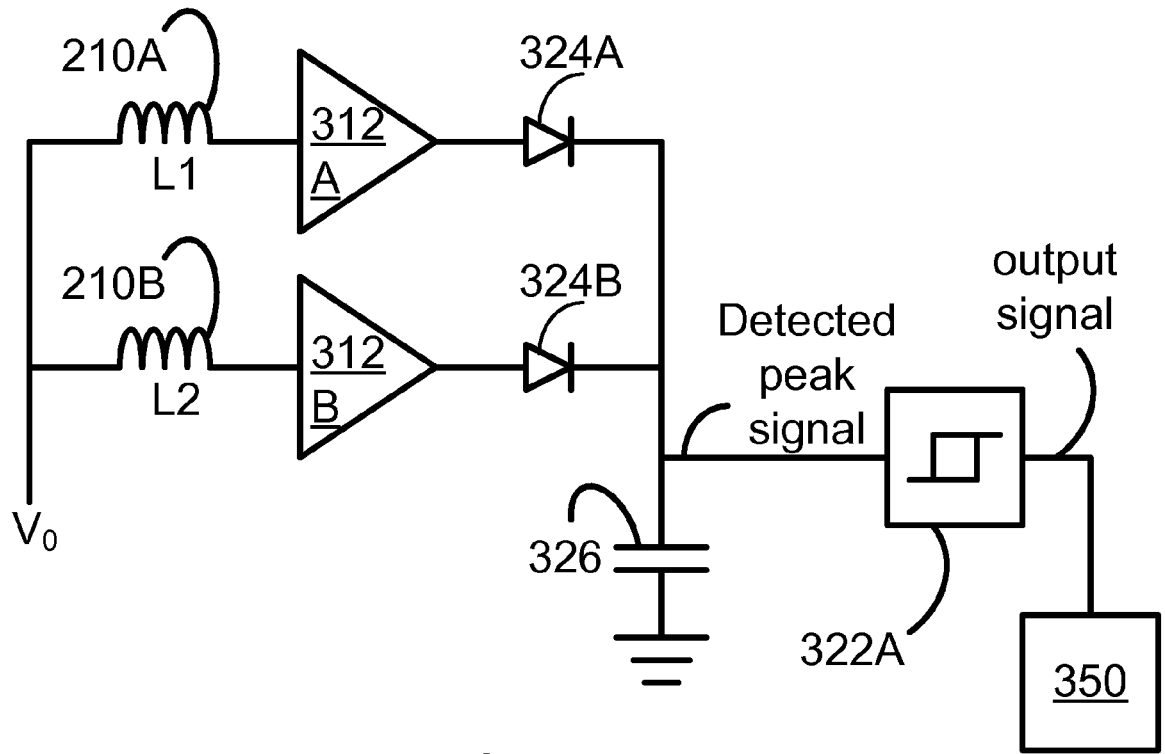

FIG. 15B shows a sensor 200 similar to the sensor of FIG. 15A, however, the comparator 322 has been implemented with a comparator 322A having a hysteresis circuit, such as by a Schmitt trigger. The comparator 322A has a first input port coupled to the output port of the amplitude detector 310 and an output port connected to the input terminal of the indicator 350. The hysteresis circuit is defined by a lower trigger point and a higher trigger point, which are additional input ports to the comparator. For example, the first input port is coupled to the output port of the amplitude detector 310, a second input port is coupled internally to the lower trigger point, and a third input port is coupled internally to the higher trigger point. The hysteresis circuit uses its hysteresis trigger points to do the comparison function. When an input signal from the first and second input signal paths is below the lower trigger point, the output signal from the hysteresis circuit is low. When the input signal passes through the lower trigger point and then passed above an upper trigger point, the output signal from the hysteresis circuit goes high. While the input signal is above the higher trigger point, the output signal from the hysteresis circuit is high. Latter when the input signal decreases passing through the upper trigger point and then passes the below the lower trigger point, the output goes low. The hysteresis circuit forms a hysteresis band between the two trigger points, which keeps the output signal from chattering or jittering near any one input level. A circuit having a single trigger point or a single reference value may experience such jittering by small noise levels on the input signal when the input signal is near the single trigger point. The hysteresis circuit may be designed in hardware, for example by a Schmitt trigger, or alternatively may be designed in software, by a controller or other programmable hardware. As is known in the art, the specific design of the Schmitt trigger circuit sets these trigger points.

Figure 16:
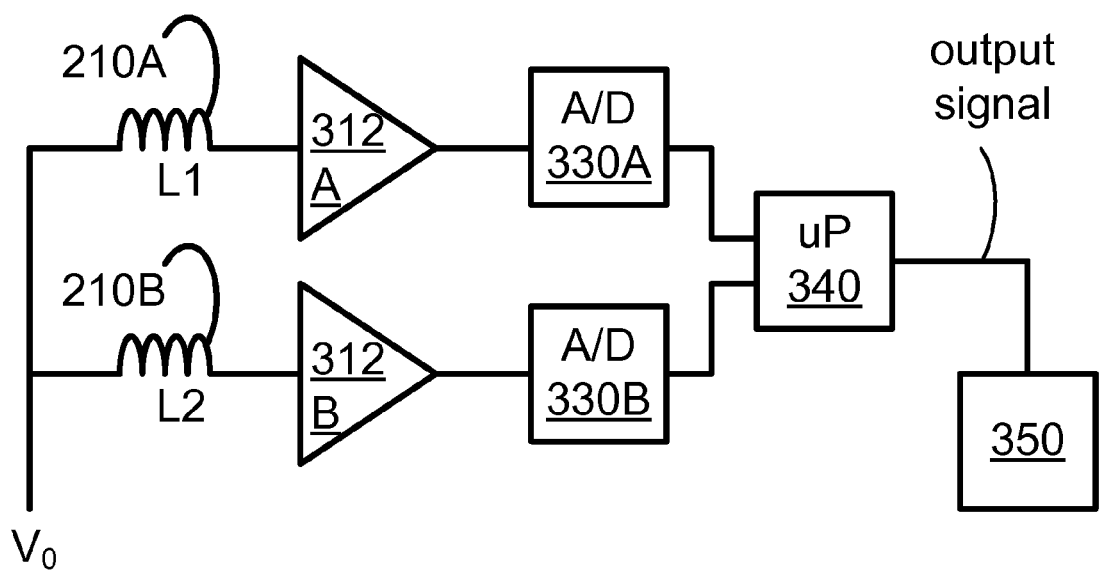
Figure 17:
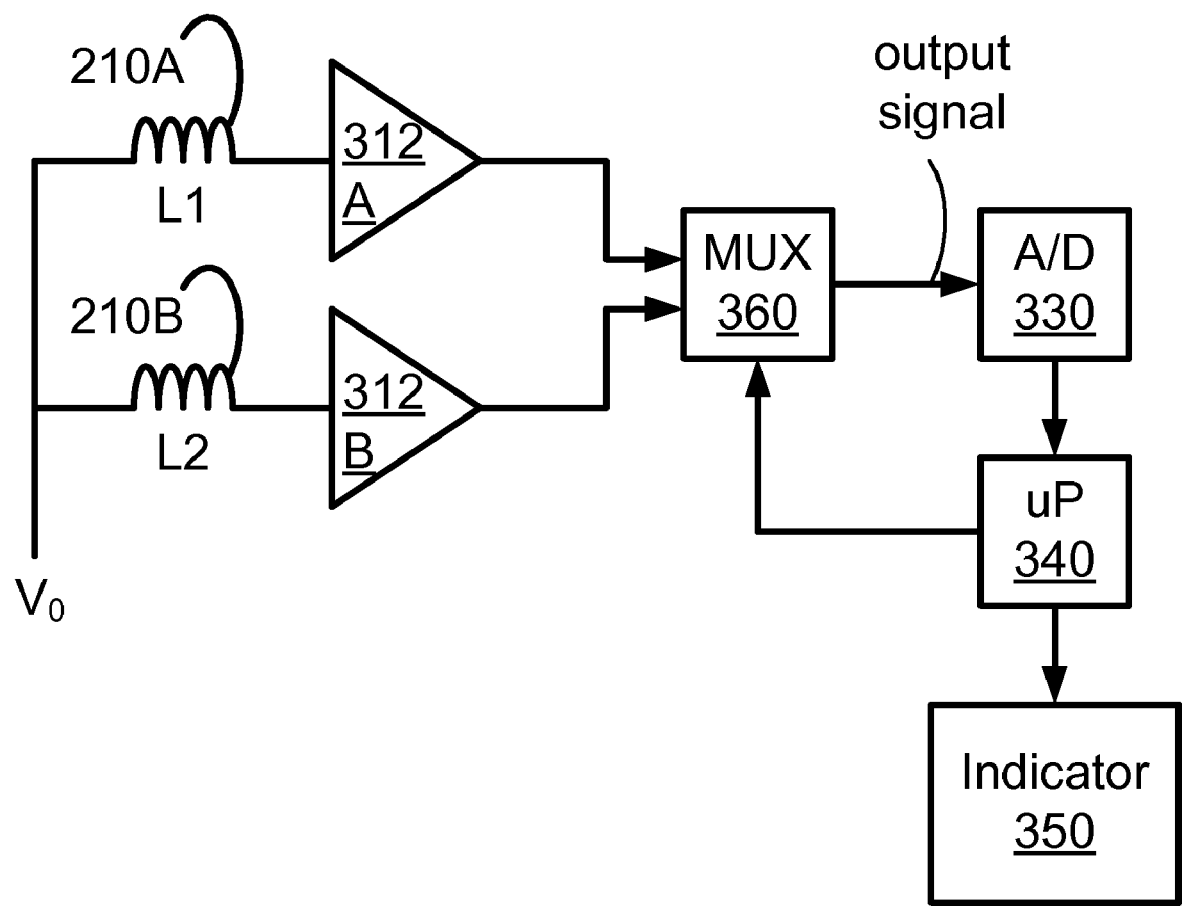

FIG. 16 shows a similar sensor 200 including a first input signal path, a second input signal path, digital logic 340 and an indicator 350. The first input signal path includes an inductor 210A, an amplifier 312A and an analog-to-digital converter 330A. A second input signal path, coupled in parallel to the first input signal path, includes an inductor 210B, an amplifier 312B and an analog-to-digital converter 330B. The digitized signals are passed to digital logic 340 or controller, such as a microprocessor (uP), microcontroller, dedicated logic, VLSI logic and/or the like. The digital logic 340 may include program and/or memory (e.g., internally or externally to a microcontroller) to execute and hold microcode as well as data, such as the reference value. The digital logic 340 may perform the functions of the amplitude detector 310 and the comparator 320 described above. The digital logic 340 provides an output signal to an indictor 350, which may be part of or separate from the sensor 200. FIG. 17 shows the circuit of FIG. 16, however, the two analog-to-digital converter are replaced with a single analog-to-digital converter 330 shared by both signal paths via a multiplexer (MUX 360) and a control signal from the digital logic 340.

Figure 18:
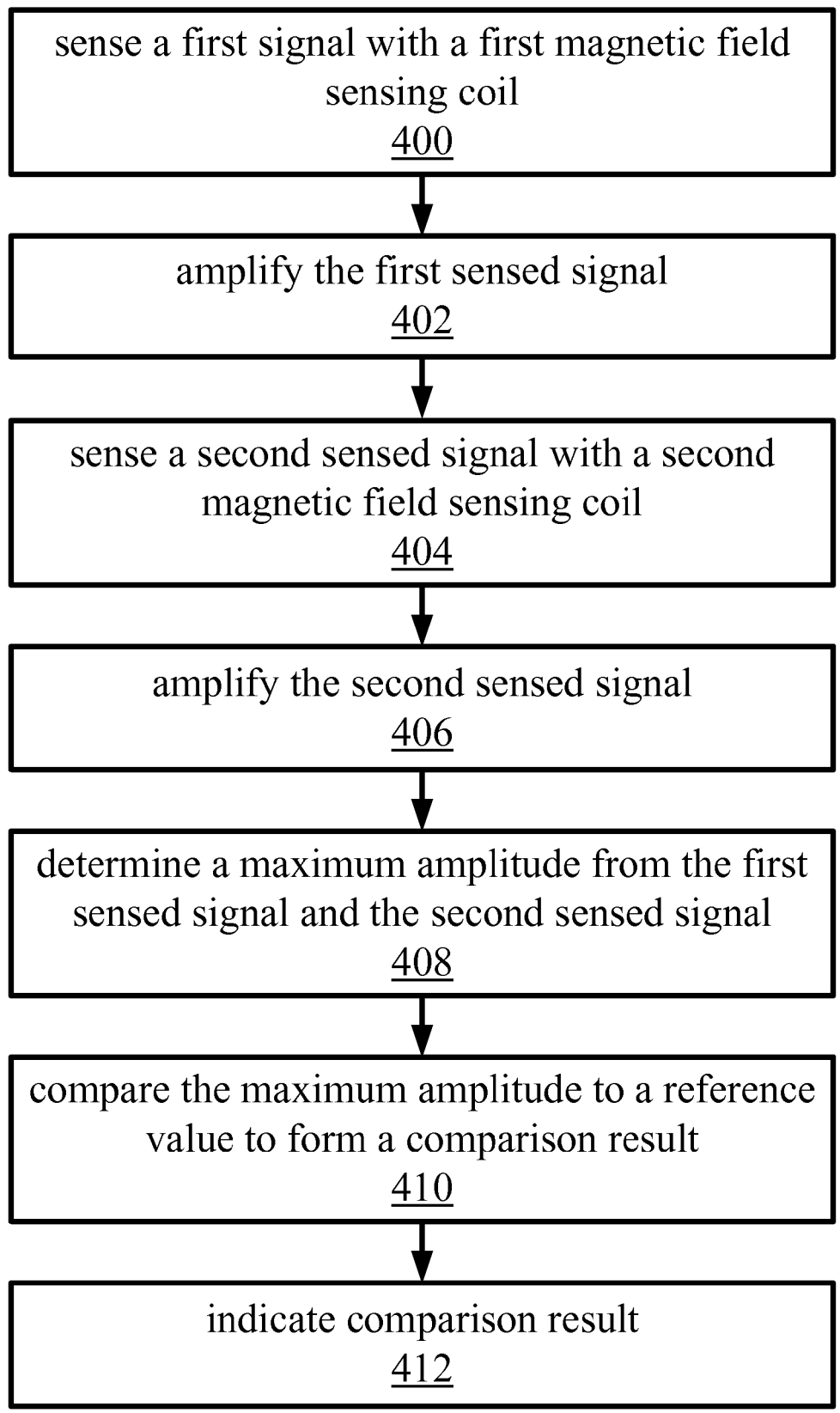
FIG. 18 shows a flow diagram of a sensor, in accordance with embodiments of the present invention.

FIG. 18 shows a flow diagram of a sensor, in accordance with embodiments of the present invention. At 400, the sensor senses a first signal with a first magnetic field sensing coil. At 402, the sensor amplifies the first sensed signal. In parallel at 404, the sensor senses a second sensed signal with a second magnetic field sensing coil. At 406, the sensor similarly amplifies the second sensed signal. Steps 400, 402, 404 and 406 may be executed in series, in parallel or a combination of series and parallel. At 408, the sensor determines a maximum amplitude from the first sensed signal and the second sensed signal. As described above, the maximum amplitude is a maximum from the two sensed signals. Prior to determining the maximum amplitude, the sensed signals may be preprocessed. For example, the sensed signals may be filtered such as by RMS averaging, low pass filtering or the like. At 410, the sensor compares the maximum amplitude to a reference value ($V_{REF}$) to form a comparison result. At 412, the sensor indicates the comparison result.

The description above provides various hardware embodiments of the present invention. Furthermore, the figures provided are merely representational and may not be drawn to scale. Certain proportions thereof may be exaggerated, while others may be minimized. The figures are intended to illustrate various implementations of the invention that can be understood and appropriately carried out by those of ordinary skill in the art. Therefore, it should be understood that the invention could be practiced with modification and alteration within the spirit and scope of the claims. The description is not intended to be exhaustive or to limit the invention to the precise form disclosed. It should be understood that the invention could be practiced with modification and alteration.

What is claimed is:

1. A sensor to detect an electrical current in plurality of electrical wires, the sensor comprising:
   a first magnetic field sensing coil providing a first sensed signal and having a first port and a center axis;
   a first amplifier having an input port coupled to the first port of the first magnetic field sensing coil and an output port;

a second magnetic field sensing coil providing a second sensed signal and having a first port and defining a center axis;

a second amplifier having an input port coupled to the first port of the second magnetic field sensing coil and an output port;

an amplitude detector having a first input port coupled to the output port of the first amplifier, a second input port coupled to the output port of the second amplifier, and an output port; and a comparator having a first input port coupled to the output port of the amplitude detector, a second input port couple to a source of a reference value, and an output port to provide an indication of a presence of the electrical current;

wherein the center axis of the first coil and the center axis of the second coil form a positive angle.

2. The sensor of claim 1, further comprising a housing containing to accept the plurality of electrical wires and containing the first magnetic field sensing coil, the first amplifier, the second magnetic field sensing coil, the second amplifier, the amplitude detector and the comparator.

3. The sensor of claim 2, further comprising a locking mechanism coupled to the housing to hold a cross-section of the plurality of electrical wires.

4. The sensor of claim 3, wherein the locking mechanism comprises a rubber band.

5. The sensor of claim 2, further comprising a means for locking the housing to the plurality of electrical wires.

6. The sensor of claim 1, wherein a controller comprises the amplitude detector and the comparator.

7. The sensor of claim 1, wherein the comparator comprises digital circuitry, and wherein the source of the reference value is memory.

8. The sensor of claim 1, wherein the comparator comprises a hysteresis circuit.

9. The sensor of claim 1, wherein the comparator comprises a Schmitt trigger.

10. The sensor of claim 1, wherein the amplitude detector comprises an analog-OR circuit.

11. The sensor of claim 1, wherein the amplitude detector comprises a maximum amplitude selector.

12. The sensor of claim 1, wherein the first magnetic field sensing coil comprises a first coil with a ferrite core and the second magnetic field sensing coil comprises a second coil with a ferrite core.

13. The sensor of claim 1, wherein the amplitude detector comprises:

a first diode having a first port coupled to the output port of the first amplifier and a second port coupled to the output port of the amplitude detector; and a second diode having a first port coupled to the output port of the second amplifier and a second port coupled to the output port of the amplitude detector.

14. The sensor of claim 1, wherein the first magnetic field sensing coil further comprises a second port coupled to a common port and wherein the second magnetic field sensing coil further comprises a second port coupled to the common port.

15. The sensor of claim 1, wherein the positive angle is a right angle.

16. The sensor of claim 1, further comprising a third magnetic field sensing coil providing a third sensed signal and having a first port and defining a center axis; and a third amplifier having an input port coupled to the first port of the third magnetic field sensing coil and an output port;

wherein the amplitude detector further has a third input port coupled to the output port the third amplifier; and wherein the center axis of the first coil and the center axis of the third coil form a second positive angle.

17. The sensor of claim 16, further comprising a fourth magnetic field sensing coil providing a fourth sensed signal and having a first port and defining a center axis; and a fourth amplifier having an input port coupled to the first port of the fourth magnetic field sensing coil and an output port;

wherein the amplitude detector further has a fourth input port coupled to the output port the fourth amplifier; and wherein the center axis of the first coil and the center axis of the fourth coil form a third positive angle.

18. A method of detecting an electrical current in a plurality of electrical wires using a sensor, the method comprising:

sensing a first sensed signal with a first magnetic field sensing coil, wherein the first magnetic field sensing coil defines a center axis;

amplifying the first sensed signal;

sensing a second sensed signal with a second magnetic field sensing coil, wherein the second magnetic field sensing coil defines a center axis, and wherein the center axis of the first magnetic field sensing coil and the center axis of the second magnetic field sensing coil define a first positive angle;

amplifying the second sensed signal;

determining a maximum amplitude from the first sensed signal and the second sensed signal;

comparing the maximum amplitude to a reference value to form a comparison result; and indicating comparison result is greater than the reference value to provide an indication of a presence of the electrical current;

wherein the center axis of the first coil and the center axis of the second coil form a positive angle.

19. The method of claim 18, wherein determining the maximum amplitude comprises:

determining a first maximum amplitude from the first sensed signal;

determining a second maximum amplitude from the second sensed signal; and selecting the maximum amplitude from the first maximum amplitude and the second maximum amplitude.

20. A sensor to detect an electrical current in plurality of electrical wires, the sensor comprising:

a first means for sensing a first magnetic field to provide a first sensed signal;

a first means for amplifying the first sensed signal;

a second means for sensing a second sensed signal;

a second means for amplifying the second sensed signal;

a means for determining a maximum amplitude from the first sensed signal and the second sensed signal;

a means for comparing the maximum amplitude to a reference value to form a comparison result; and a means for indicating the comparison result to provide an indication of a presence of the electrical current;

wherein a center axis of the first sensing means and a center axis of the second sensing means form a positive angle.

21. The sensor of claim 20, further comprising a means for locking the sensor to hold a cross-section of the plurality of electrical wires.

* * * * *